(12) United States Patent
Carey (10) Patent No.: US 9,966,908 B1
(45) Date of Patent: May 8, 2018

(54) CIRCUIT FOR AND METHOD OF IMPLEMENTING A DIFFERENTIAL INPUT RECEIVER

(71) Applicant: Xilinx, Inc., San Jose, CA (US)

(72) Inventor: Declan Carey, Douglas (IE)

(73) Assignee: XILINX, INC., San Jose, CA (US)

( * ) Notice: Subject to any disclaimer, the term of this patent is extended or adjusted under 35 U.S.C. 154(b) by 0 days. days.

(21) Appl. No.: 15/612,826

(22) Filed: Jun. 2, 2017

(51) Int. Cl.
| H03F 1/30 | (2006.01) |
| H03F 1/52 | (2006.01) |
| H03F 3/45 | (2006.01) |
| H03F 1/56 | (2006.01) |
| H04B 1/16 | (2006.01) |

(52) U.S. Cl.
CPC .......... *H03F 1/52* (2013.01); *H03F 1/56* (2013.01); *H03F 3/45071* (2013.01); *H04B 1/16* (2013.01); *H03F 2200/222* (2013.01)

(58) Field of Classification Search
CPC .......... H03F 1/52; H03F 3/45071; H03F 1/56; H03F 2200/222; H04B 1/16
See application file for complete search history.

(56) References Cited

U.S. PATENT DOCUMENTS

| 6,369,612 B1 | 4/2002 | Shokouhi |
| 6,496,044 B1 | 12/2002 | Nguyen et al. |
| 6,628,151 B1 | 9/2003 | Zhou et al. |
| 6,838,924 B1 | 1/2005 | Davies, Jr. |
| 6,842,043 B1 | 1/2005 | Nguyen et al. |
| 6,980,035 B1 | 12/2005 | Zhou et al. |
| 6,985,019 B1 | 1/2006 | Zhou et al. |
| 7,317,333 B1 | 1/2008 | Zhou et al. |
| 7,408,381 B1 | 8/2008 | Drimer et al. |
| 7,468,615 B1 | 12/2008 | Tan et al. |
| 7,521,987 B1 | 4/2009 | Cullen et al. |
| 8,237,497 B2 * | 8/2012 | Wen .................... H03F 3/45475 330/254 |

(Continued)

OTHER PUBLICATIONS

Dong et al., Integrated Linear AC-coupling Circuit for DC Balanced and Non-Balanced Traffics, LSI Logic Corp., IEEE, 2007.

(Continued)

*Primary Examiner* — Dac Ha
(74) *Attorney, Agent, or Firm* — John J. King (57) ABSTRACT

A circuit for implementing a differential input receiver is described. The circuit comprises an input circuit having a first input node and a second input node configured to receive a differential input signal; a first output circuit having a first capacitor coupled between the first input node and a first output node and a second capacitor coupled between the second input node and a second output node, wherein the first output circuit generates an output signal at the first output and the second output when the input signal is in a first frequency range; and a second output circuit comprising an amplifier having a first amplifier input coupled to the first input node and a second amplifier input coupled to the second input node, wherein the second output circuit generates an output signal when the input signal is in a second frequency range which extends lower than the first frequency range. A method of implementing a differential input receiver is also described. The circuits and methods also allow for offset compensation.

20 Claims, 4 Drawing Sheets

(56) References Cited

U.S. PATENT DOCUMENTS

| | | |
|---|---|---|
| 8,469,640 B2 | 6/2013 | Maillard et al. |
| 9,054,646 B2 * | 6/2015 | Nicollini ................... H03F 1/30 |
| 9,093,987 B1 | 7/2015 | Gorman |
| 9,281,807 B1 | 3/2016 | Maillard et al. |
| 9,438,244 B2 | 9/2016 | Sood et al. |
| 2009/0212855 A1 * | 8/2009 | Mitchell ................... H03F 1/34 |
| | | 327/552 |

OTHER PUBLICATIONS

Francese et al., A 16 Gb/s Receiver with DC Wander Compensated Rail-to-Rail AC Coupling and Passive Linear-Equalizer in 22 nm CMOS, IBM Research—Zurich, Switzerland, IEEE, 2014.

Kim et al., A Four-Channel 32-Gb/s Transceiver With Current-Recycling Output Driver and On-Chip AC Coupling in 65-nm CMOS Process, IEEE Transactions on Circuits and Systems—II: Express Briefs, vol. 61, No. 5, May 2014.

Zhuang et al., Linear Equalization and PVT-Independent DC Wander Compensation for AC-Coupled PCIe 3.0 Receiver Front End, IEEE, 2011.

\* cited by examiner

CIRCUIT FOR AND METHOD OF IMPLEMENTING A DIFFERENTIAL INPUT RECEIVER

TECHNICAL FIELD

The present invention relates generally to integrated circuit devices, and in particular, to a circuit for and method of implementing a differential input receiver.

BACKGROUND

A differential input receiver may receive differential inputs at input/output pads of an integrated circuit. Input signals may have a range of common mode voltages (VCMs). In many cases, it may be necessary to shift the differential input signals to generate a signal having a different common mode voltage within the integrated circuit receiving the differential input signal.

However, shifting a common mode voltage may have a number of drawbacks. For example, when implementing an AC coupled receiver input, blocking capacitors may allow for independent receiver and transmitter common mode levels, but such solutions may have a high-pass characteristic with a given cut-off frequency, where signal loss below this cutoff frequency leads to base line wander. DC coupled solutions may be hampered by common mode level restrictions, offset complications or undesirable design trade-offs for component values.

Accordingly, methods and circuits for implementing a differential input receiver that enable the shifting of the signal are beneficial.

SUMMARY

A circuit for implementing a differential input receiver is described. The circuit comprises an input circuit having a first input node and a second input node configured to receive a differential input signal; a first output circuit having a first capacitor coupled between the first input node and a first output node and a second capacitor coupled between the second input node and a second output node, wherein the first output circuit generates an output signal at the first output and the second output when the input signal is in a first frequency range; and a second output circuit comprising an amplifier having a first amplifier input coupled to the first input node and a second amplifier input coupled to the second input node, wherein the second output circuit generates an output signal when the input signal is in a second frequency range which extends lower than the first frequency range.

A method of implementing a differential input receiver is also described. The circuit comprises configuring a first input node and a second input node to receive a differential input signal; coupling a first capacitor between the first input node and a first output node; coupling a second capacitor between the second input node and a second output node; generating an output signal at the first output node and the second output node when the input signal is in a first frequency range; coupling a first amplifier input of an amplifier to the first input node and a second amplifier input of the amplifier to the second input node; and generating an output signal based upon outputs of the amplifier when the input signal is in a second frequency range which extends lower than the first frequency.

Other features will be recognized from consideration of the Detailed Description and the Claims, which follow.

DETAILED DESCRIPTION

The circuits and methods set forth below disclose an interface circuit that may be located in the receiver circuit coupled to the receiver (RX) input pads. The interface circuit may be compatible with conventional 50-Ohm terminations, and transfer or couple an input signal with broadband characteristics from the receiver input pads to input receive chain circuits, while translating the signal common mode from the optimal transmitter (TX) level (i.e. the level received at the receiver input pads) to the optimum level for a signal processing circuit of the receiver, such as a continuous time linear equalizer (CTLE) for example.

Front-end amplifiers of the receiver may be connected to the external environment at the pads or bumps of an IC. The common mode at the receiver pads may be set at the receiver or the transmitter. However, the optimum common mode level for the receiver and transmitter circuits may not be the same. The circuits and methods set forth below allow system and circuit designers to have independent freedom to choose the TX and RX common mode levels. The circuit permits use of true rail-to-rail input common mode levels (i.e. 0V to the supply voltage), and can sustain a more limited but still functional performance outside this common mode range. The circuits and methods also allow for offset compensation.

The RX input circuit functions by implementing two paths for the signal. The high frequency path consists of two single-ended paths through two capacitors. The low frequency path consists of a single fully differential amplifier with a resistor feedback network. According to one implementation, the high frequency path may be a passive high frequency path, while the low frequency path may be an active low frequency path. Feed forward resistors link the high and low frequency paths. The differential amplifier is subject to output common mode control, with a wide common mode input range. The input common mode range at the feed-forward amplifier block may be narrower than the common mode range at the RX pads by virtue of the use of resistor dividers. Offset compensation may be injected along the resistor dividers.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Figure 1:
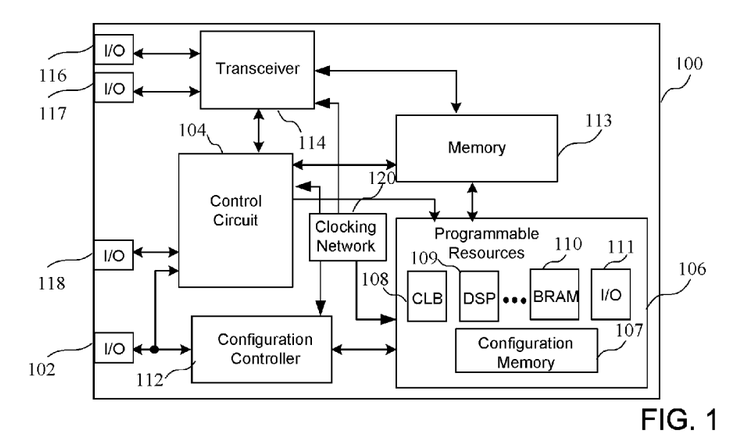
FIG. 1 is a block diagram of an integrated circuit device having I/O pads for receiving differential inputs.

Turning first to FIG. 1, a block diagram of an integrated circuit device having I/O circuits is shown. In FIG. 1, a block diagram of an integrated circuit 100 comprising a circuit for transmitting and receiving data in the integrated circuit is shown. In particular, an input/output port 102 is coupled to a control circuit 104 that controls programmable resources 106 having configuration memory 107, configurable logic elements 108, digital signal processing (DSP) blocks 109, analog-to-digital (ADC), blocks of random access memory (BRAMs) 110, and I/O blocks 111. As will be described in more detail below, the various circuit blocks of the programmable resources 106 may be implemented as redundant circuits which may be selected based upon a voltage value of the reference voltage. Configuration data may be provided to the configuration memory 108 by a configuration controller 112. The configuration data enables the operation of the programmable resources 106. A memory 113 may be coupled to the control circuit 104 and the programmable resources 106. A transceiver circuit 114 may be coupled to the control circuit 104, programmable resources 106 and the memory 113, and may receive signals at the integrated circuit by way of I/O pads 116 and 117. Other I/O ports may be coupled to circuits of the integrated circuit device, such as I/O pad 118 that is coupled to the control circuit 104 as shown. A clocking network 120 is coupled to various elements of the circuit of FIG. 1. The circuits and methods set forth below may be implemented using the elements of FIG. 1, such as the I/O pads and transceiver of FIG. 1.

Figure 2:
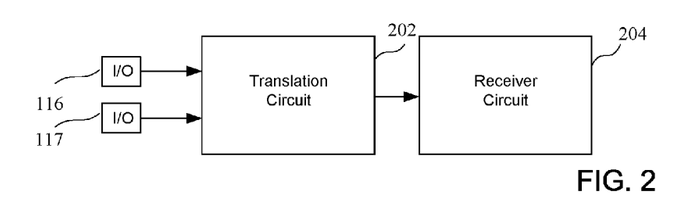
FIG. 2 is a block diagram of a circuit for receiving a differential input signal.
Figure 3:
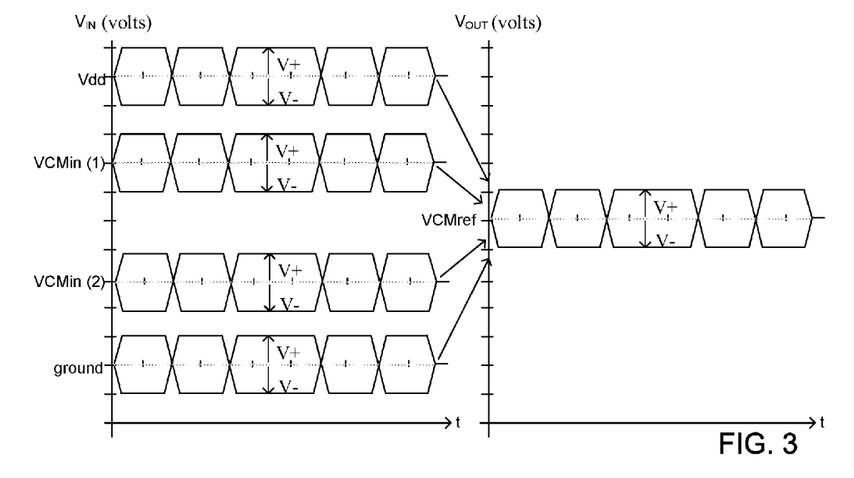
FIG. 3 is a timing diagram showing exemplary input signals at input pads of a receiver and a signal at inputs of a receiver circuit.

Turning now to FIG. 2, a block diagram of a circuit for receiving a differential input signal is shown. In particular, I/O pads 116 and 117 are coupled to a translation circuit 202 that enables the translation of a differential input signal which is applied to a receiver circuit 204. The translation circuit 202 allows for the translation of an input signal provided to the input of the translation circuit 202 and having a first common mode voltage to a second common mode voltage. The first common mode voltage may be any common mode voltage between ground and a reference voltage Vdd to allow for a rail-to-rail input common mode receiver. The second common mode voltage may be a selected reference common mode voltage VCMref. It should be noted that while only a single differential input signal would be provided to the input pads 116 and 117, the example inputs on the left of FIG. 3 show the voltage swing V+/V− centered on 4 different common mode levels, ground, VCMin1, VCMin2 and Vdd. The output provided on the right shows that the signal swing is translated to the VCMref level, regardless of the VCM of the input signal. As will be described in more detail below, the signal swing (represented by a value of V+ above the VCMref and V− below the VCMref in FIG. 3) of the output signal generated at the output of the translation circuit 202 could also be controlled using offset injection.

The circuit will enable an effective translation of the input signal between 2 common mode levels. However, the translation of the signal involves its average and any differential on top of this, where any voltage level might be represented by vavg+vsig. For a given process (or semiconductor manufacturing technology node), limitations are placed on the absolute value of a signal (i.e. vavg+vsig), where a limit may be driven by process reliability concerns. One process reliability concern would be direct device breakdown. Devices inside the integrated circuit may prohibited from being exposed to voltages too far above or below the supply rails, as the devices may experience breakdown. A second concern would be the presence of electrostatic discharge (ESD) protection circuits specifically placed to deal with short term exposure to excessive voltage spikes. Such ESD circuits might take the form of diode based clamps as an example. For common mode levels outside the 0V-supply range, the signals would be subject to these limits. By way of example, consider the supply rail is 1.2V but the devices at the integrated circuit input could sustain 1.5V and the ESD diodes had a turn on of 0.5V. Accordingly, the signal could be allowed to rise to the lesser of 1.5V or 1.2+0.5=1.7V. By way of example, permitted situations for vavg+vsig might be 1.2+0.3(V), 1.3+0.2(V), 1.4+0.1(V). Depending on the common mode level, only certain signal swings are allowed. A similar example can be constructed for negative voltages with respect to 0V, ground.

Figure 4:
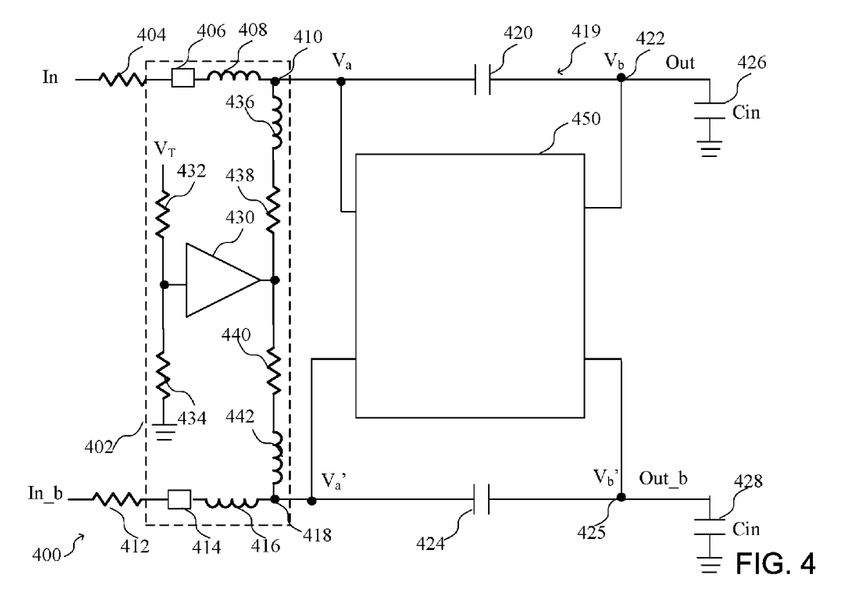
FIG. 4 is a block diagram showing a first output circuit and a second output circuit.

Turning now to FIG. 4, a block diagram 400 shows a first output circuit and a second output circuit which could be implemented as the translation circuit 202. Several nodes and components are labelled with an apostrophe, such as Vb and Vb'. Explanations will use one or both with the assumption that the nodes, functions and components are similar, matched and/or complementary.

According to the implementation of FIG. 4, an input circuit 402 comprises a first input for receiving a first input signal (In) of a pair of differential input signals having an input resistance 404 at a receiver input pad 406. An inductor 408 is coupled to a node 410, at which a voltage Va is generated. The input circuit 402 comprises a second input resistance 412 coupled to a second input pad 414. The resistors 404 and 412 are intended to represent either the resistance external to the IC, such as either the output impedance of the transmitter or the channel characteristic impedance. Resistors 438 and 440 would represent the impedance matching devices for 404 and 412. Typically 404 and 412 are both 50 Ohms in the case of communications channels, but they are not restricted to this value. An inductor 416 at the input pad is coupled to a node 418 at which a voltage Va' is generated. A first output circuit 419 comprises a first path having a first capacitor 420 coupled between the node 410 and a first output node 422, at which a voltage Vb is generated as an output signal (Out). A capacitor 426, representing a load capacitance Cin, is shown at the output node 422. The first output circuit 419 also comprises a second capacitor 424 coupled between the node 418 and a second output node 425, at which a voltage Vb' is generated as an inverted output signal (Out_b). A capacitor 428 representing a load capacitance Cin, is shown at output node 425. Cin refers to the load capacitance of the next stage in the receiver chain, which may be a continuous-time-linear-equaliser or other signal amplifier, a DFE summer block, or a data slicer for example. The first output circuit 419 enables the receipt of input signals in a first frequency range.

The input circuit 402 may also have an optional voltage termination circuit comprising an amplifier 430 having an input coupled to a node of a resistor divider comprising a first resistor 432 coupled to a reference voltage $V_T$ and a second resistor 434 coupled to ground. An output of the amplifier 430 is coupled to a first series inductor 436 and resistor 438 and to a second series resistor 440 and inductor 442. The inductor 436 is coupled between the node 410 and the resistor 438, which is coupled to the output of the amplifier. The output of the amplifier is coupled to the resistor 440, which is coupled to a first terminal of the inductor, the second terminal of which is coupled to the node 418.

A second output circuit 450 provides third and fourth paths between outputs of the input circuit 402 and the output nodes 422 and 425. As will be described in more detail below, the second output circuit enables the receipt of input signals in a second frequency range that is lower than the first frequency range. An example of a circuit for transmitting signals in a lower frequency range will be described in more detail in reference to FIG. 5. The frequency range of the second output circuit 450 may be determined by the unity gain bandwidth of an amplifier of the second output circuit, along with the combination of a resistor and a capacitor at the output. In the example given the second frequency has a lower limit of 0 Hz, DC.

The circuit of FIG. 4 may be connected to input devices in a load circuit, which could be any front-end interface circuit that does not draw appreciable DC current. By way of example, the load circuit could be a n-type metal oxide semiconductor (NMOS) circuit, a p-type metal oxide semiconductor (PMOS) circuit, a capacitive sampling circuit, a continuous time linear equalizer (CTLE) circuit, a current mode logic (CML) circuit, for example.

Figure 5:
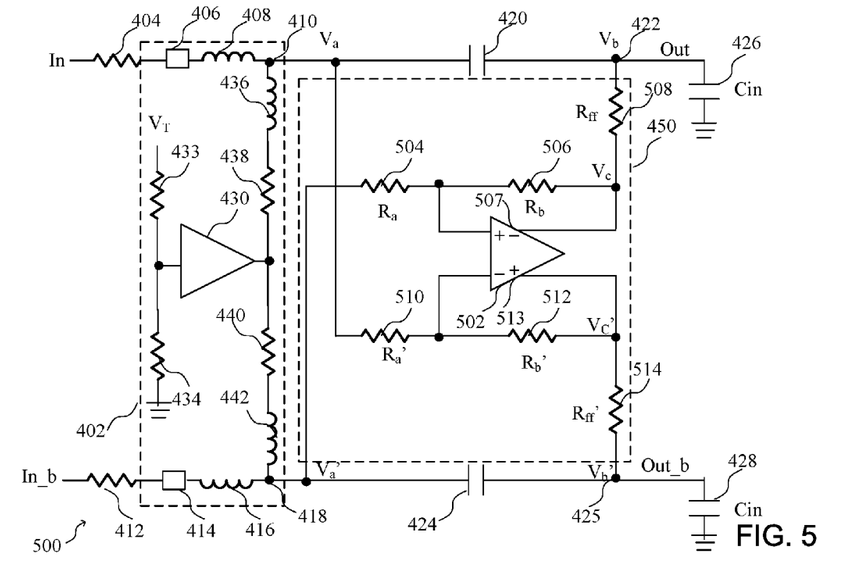
FIG. 5 is another block diagram showing additional elements of the second output circuit of FIG. 4.

Turning now to FIG. 5, another block diagram 500 shows additional elements of the second output circuit 450 of FIG. 4. More particularly, a feed forward amplifier 502 has a first input coupled to a first resistor network comprising a first resistor (Ra) 504 and a second resistor (Rb) 506 coupled between the node 418 and an output of the feed forward amplifier 502, where the node between the resistor 504 and the resistor 506 is coupled to a first input of the feed forward amplifier 502. The feed forward amplifier 502 also has a second resistor network comprising a third resistor (Ra') 510 and a fourth resistor (Rb') 512. A node between the resistor 510 and the resistor 512 is coupled to the second input of the feed forward amplifier 502. Outputs of the feed forward amplifier 502 are coupled to the output nodes by way of feed forward resistors. That is, a first output 507 is coupled at the resistor 506 and a feed forward resistor (Rff) 508 at the node 422. A second output 513 is coupled at the resistor 512 and a feed forward resistor (Rff') 514 at the node 425.

The translation circuit of FIG. 5 allows for a common mode transition between the common mode at the RX input pads and the desired common mode at Vb/Vb' for example. The inputs to the succeeding block in the receiver chain may be, as an example, the gate terminals of CMOS devices, where no appreciable DC current flows in Rff and Rff'. DC current can flow in Ra, Rb in either direction to develop the voltage difference needed to implement common mode translation. The common mode at the RX pads can have values between the supply rails, and can in limited cases exceed the rails. If the process devices can sustain the voltage, and if the ESD of the receiver integrated circuit (IC) permits, the absolute voltage at the input pads may be exceed the supply rails. As the common mode exceeds the rails, the signal swing permitted would start to diminish. Some IC's may specifically prohibit any input signal to exceed the supply rails, on an application and process specific basis. Also, it should be noted that the circuit translates the input common mode to the desired output common mode. The input common mode to the feed forward amplifier (FFA) may be halfway between these two targets in the case where Rb=Ra and the FFA block has high impedance inputs. The feed forward amplifier can be designed with a wide input common mode range, but the feed forward amplifier, in combination with the desired output common mode level, may influence how far in excess of the rails the input common mode can be. Ignoring offset currents, the common mode voltages at Va and Vb can be represented by:

$$Vcm(Vb,Vb')-Vcm(Va,Va')=i(Ra)*(Ra+Rb)=i(Rb)*(Ra+Rb) \quad (1)$$

In equation (1), Vcm(Vb,Vb') refers to the common mode voltage of the node pair Vb, Vb'. In addition, i(Ra) refers to the current flowing in the resistor Ra. Similar definitions apply to Vcm(Va, Va') and i(Rb).

The path having capacitor 420 provides useful signal gain in the frequency range above a corner frequency mainly determined by the combination of resistor 508 and capacitor 420. If the amplifier 502 has a sufficiently high bandwidth, then the amplifier and capacitor paths will to a first order overlap, with both having the same corner frequency set by resistor 508 and capacitor 420. The path of amplifier 502 operates below this corner frequency, while the capacitive path (though capacitor 420) operates above it. If the amplifier 502 is too slow, then the amplifier path may inhibit signal transmission below the corner frequency established by the resistor 508 and the capacitor 420. This condition may manifest itself as an undesirable ripple in the input/output voltage transfer function across frequency. The amplifier would preferably have sufficient bandwidth to give a flat response, where a design trade-off exists between the area required to implement the capacitors and the resistors at the output nodes and the power required for the amplifier to exceed this corner frequency by a sufficient margin. By way of example, a 1 pF capacitor could be used for capacitors 420 and 424 for the high frequency path and 100 kOhm for resistors 508 and 514 connecting the low frequency path, where a corner frequency would be approximately equal to 1.592 MHz. The low frequency path could have a frequency range of approximately 0 Hz, DC to 1.592 MHz, and the high frequency path could have a frequency range of approximately 1.592 MHz to a maximum operating frequency. The maximum operating frequency would usually be determined by other factors (e.g., t-coil implementation for input impedance matching, effective-series-resistance of the Cac element as examples, parasitic capacitance load, and Cin). A sample maximum operating frequency might be 10 GHz, and most certainly higher, enabling the circuit to be compatible with RF operation. For a corner frequency of 1.592 MHz, the FFA unity gain frequency would be typically up a decade higher (i.e. greater than 10*1.592 MHz, or >15.92 MHz).

Figure 6:
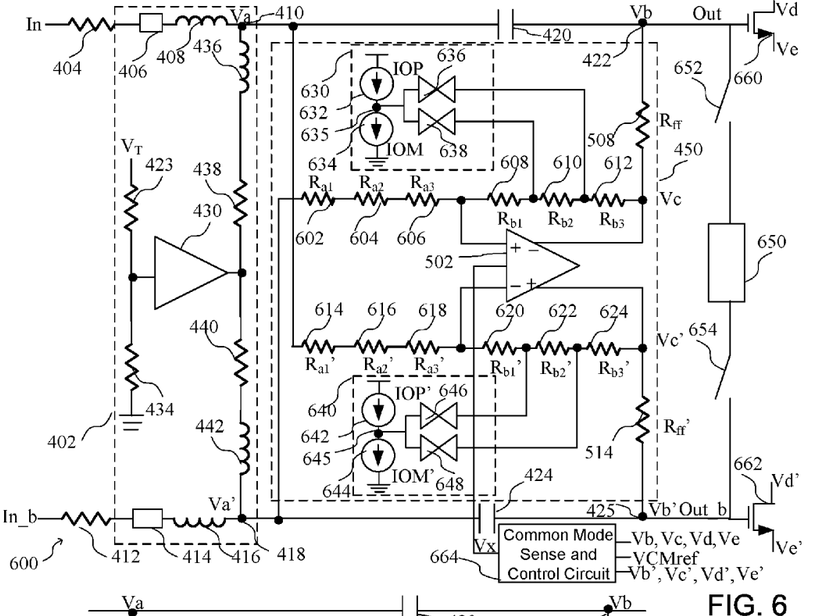
FIG. 6 is another block diagram showing a first output circuit and a second output circuit having offset compensation circuits.

Turning now to FIG. 6, another block diagram 600 shows a first output circuit and a second output circuit having offset compensation circuits. According to the implementation of FIG. 6, each of the resistors Ra, Rb, Ra' and Rb' are divided to create a resistor divider network. In particular, Ra is divided into resistors 602, 604, and 606, resistor Rb is divided into resistors 608, 610, and 612, resistor Ra' is divided into resistors 614, 616, and 618, and resistor Rb' is divided into resistors 620, 622, and 624. A first offset compensation circuit 630 comprises a first current source 632 coupled in series with a second current source 634 at a node 635. A first transmission gate 636 is coupled between the node 635 and a node between resistor 610 and 612. A second transmission gate 638 is coupled between the node 635 and a node between resistors 608 and 610. The current through the first and second transmission gates can be controlled by the current sources 632 and 634 to provide offset injection and control the voltage Vc at the output feed forward resistor 458. Similarly, a second offset compensation circuit 640 comprises a third current source 642 coupled in series with a fourth current source 644 at a node 645. A third transmission gate 646 is coupled between the node 645 and a node between resistor 620 and 622. A fourth transmission gate 648 is coupled between the node 645 and a node between resistors 622 and 624. The current through the third and fourth transmission gates can be controlled by the current sources 642 and 644 to provide offset injection and control the voltages at the feed forward resistor 464.

An optional passive equalizer 650 may be coupled between the output nodes 422 and 425, and may be controlled by switches 652 and 654, which may be transistor switches for example. An output transistor 660 having a gate coupled to node 422 may be implemented to generate sense voltages Vd and Ve, while an output transistor 662 having a gate coupled of node 425 may be implemented to generate sense voltages Vd' and Ve'. A control circuit 664 may be implemented to control the feed forward amplifier 502, as will be described in more detail below. The control circuit 664 is coupled to receive the pairs of voltages at different nodes, such as the pairs Vb and Vb', Vc and Vc', Vd and Vd', and Ve and Ve', as well and the reference common mode voltage VCMref. The control circuit 664 generates a control voltage Vx, which enables generating the correct common mode voltage at the output.

Vx is the interface node between a sense block and the common mode control port of the feed forward amplifier. The common mode control port of the FFA block functions as follows. As Vx rises or falls, where it is expected that this is a control signal between the supply rails, then the output common mode of the feed forward amplifier, which is a fully differential amplifier, will rise or fall. The sign of this operation, i.e. whether a rise or fall causes a rise/fall or fall/rise in the feed forward amplifier output common mode depends on the sign of the gain through the common mode sense and control circuit. An implementation of the common mode sense and control circuit might be (i) a resistor string to obtain the average value of Vc/Vc', i.e. 0.5*(Vc+Vc') and (ii) an operational transconductance amplifier [OTA] comparing the Vc average with VCMref. Vx could be connected directly to the output of this OTA. The stability compensation network for this negative feedback loop will depend on which pair (Vb, Vc, Vd, Ve etc.) is being sensed, since they would all have different frequency responses. While FIG. 6 explicitly shows NMOS devices as the load, it should be noted that in addition to the equalizer 650 (drawing no appreciable DC current) being optional, those load transistors might be NMOS, PMOS or another capacitive load circuit.

The value VCM may be established by a resistor string with Vc at one end and Vc' at the other. The halfway point on the resistor string would provide a voltage at the common mode (or average, vcmsense) of Vc and Vc'. An amplifier may be used to compare this average voltage (vcmsense) with a reference voltage, VCMref. The control circuit may have only have a single sensed pair and a single VCMref value, where any of Vc, Vb, Vd or Ve might be the controlled node. It is possible for example that the load stage (for which input transistors 660 and 662 is shown, connected to Vd and Ve) might be designed such that it functions optimally with a well-controlled Vb node. In another example, it may be that the load stage would function best with Ve as the controlled node.

VCMref would be set to the desired common mode level for whatever node pair is under control. If the implementation is such that 0.5*(Vb+Vb')=0.75V for example, then VCMref will be 0.75V. The design may require that 0.5*(Ve+Ve')=0.2V, then VCMref would be 0.2V. VCMref may be generated using a constant voltage, such as a bandgap based reference or a MOS threshold voltage. Alternatively, it might have a value with proportionality (or inverse proportionality) to on-chip resistors for example. The best choice of sensed node pair and the target common mode will be application-specific.

Therefore, the node pair under control (e.g. Vb, Vc, Vd or Ve) and the associated VCMref (as the target for the control loop) do not have to be related to the input common mode voltage at the receiver input pads. The controlled common mode can be any value that assists in high performance in the load stage, independent of the level at the pads. Accordingly, the translation circuit operates as a level shifter, taking input at a common mode level between ground and supply (and even slightly outside it in certain cases) and translating it to the target level.

The generation of VCMref would depend on the nature of the controlled target values. Examples would include, but are not limited to, a ground referenced value to set Vb or Vc to have a constant voltage with respect to 0V, or a fractional supply reference, again with Vb or Vc as the targets. The limitation placed on the controlled target is that the desired VCM set point (at the target node) in the context of a desired signal swing should be achieved with the output voltages of the amplifier 502 within a saturation voltage of the supply rail of the FFA block. Stated otherwise, Vc, Vc' should remain within a saturation voltage of the supply of the amplifier 502.

Offset injection is implemented to cancel offsets both in this entire block, but also in the subsequent down-stream circuits. Rb may be split into 'n' separate components. A sample split of n=3 is illustrated, where Rb is represented by Rb1+Rb2+Rb3. The split of the resistor Rb does not have to be into 3 segments, but could be any number of segments. For matching reasons, Ra may be split in the same manner, but this is not required. The Rb splits creates new intermediate nodes between Rb1/Rb2 and between Rb2/Rb3. The split does not have to be limited to 3. Offset injection sources IOP/IOM allow for bidirectional current flow in one of the transmission gates. Current flows in the opposite direction in the complementary gate. For FIGS. 6, 636 and 648 are complementary gates. The amplifier circuit 502 and the split of resistor Rb may be designed so that the offset current flows in such a way to generate or cancel differential voltage at Vc/Vc'.

While Ra is shown as a split resistor, it should be noted that the gain of the two paths can be calibrated, and adjusting Ra might form a part of that calibration. The capacitive path may be tunable, where the resistive gain path (Ra, Rb, FFA) could be calibrated to match the first gain path. It's also conceivable that Ra and Rb might be chosen to deliberately implement an equalising type transfer function, which provides additional functionality. If Ra≠Rb, the VCM at the FFA input would not be halfway between the VCM of the input pads and output VCM target, but would take some other value dependent on the Ra, Rb ratio.

Figure 7:
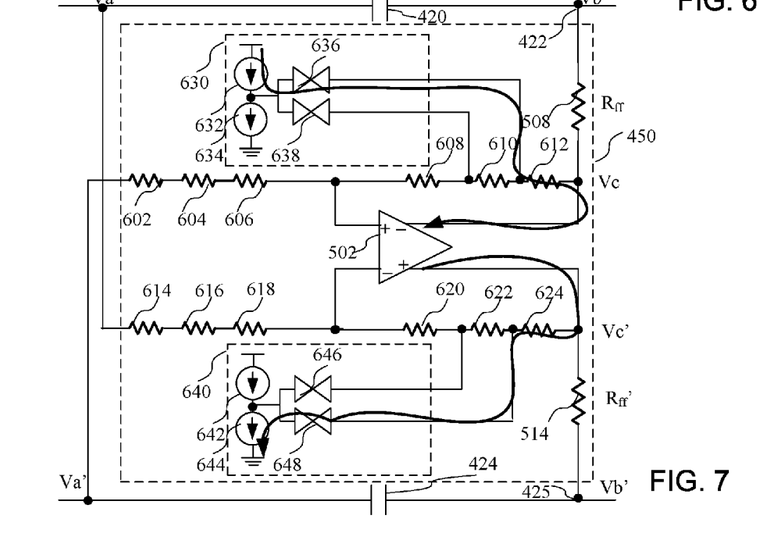
FIG. 7 is a block diagram showing the operation of the offset compensation circuits of FIG. 6.

Turning now to FIG. 7, a block diagram showing the operation of the offset compensation circuits of FIG. 6 is shown. An example of such a design would specify an output impedance for the amplifier 502 which is substantially lower than Ra, Rb. The resistive split may also be designed with Rb3 lower than Rb1 and/or Rb2. The offset current would then primarily flow in Rb3, and in the opposite direction in Rb3'. If the transmission gates 638 and 646 are enabled, while gates 636 and 648 are disabled, then the offset current would flow in resistors Rb2 and Rb3 (and Rb2', Rb3'), generating an increased differential voltage compared to the implementation of FIG. 7. If for example the transmission gates 636 and 648 are enabled (with 638, 646 disabled), then the offset current would flow in Rb3 as shown in FIG. 7, leading to a reduced differential voltage. The ability to permit multiple splits in Rb and allow multiple injection points along the resistor string allows for the same input current to generate several values of offset voltage. The current sources may be current digital-to-analog converters (DACs), with the current controlled according to an input code. In effect the choice of which transmission gate pair to use allows for variable gain to be applied to the offset current DAC's.

The high frequency gain of the circuit is dominated by the capacitive divider between the capacitor elements 420 and 424, the input capacitance of the active circuit load. A simplified gain expressions for a high frequency gain could be:

$$\text{High\_Frequency\_Gain} = Cac/(Cac+Cin) \quad (2)$$

The low frequency gain of the circuit is dominated by the Ra, Rb resistive divider and the amplifier 502, where a simplified (excluding the FFA output impedance and finite gain) low frequency gain expression could be:

$$\text{Low\_Frequency\_Gain} = (Rb1+Rb2+Rb3 \ldots +Rbn)/(Ra1+Ra2+Ra3 \ldots +Ran) \quad (3)$$

The voltage gains are also influenced by the impedance match at the input pads. The input 50 Ohm or Ra may be adjusted to provide a precise input match, depending on the specification for return loss. Including return loss matching elements in Ra or Rb may be used to tune the low frequency Ra/Rb gain relation. Ra and or Rb may be tuned to allow an equalizer type response.

Figure 8:
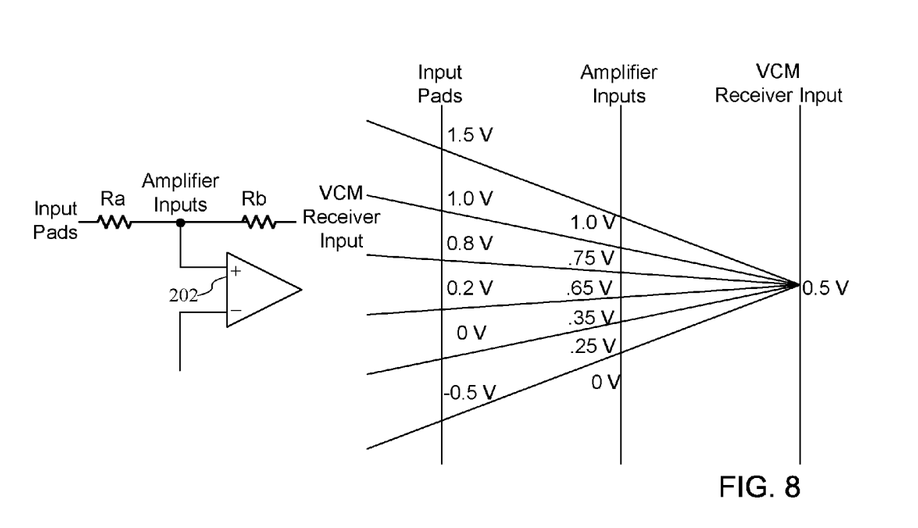
FIG. 8 is a block diagram of example voltages at nodes of the second output circuit.

Turning now to. 8, a block diagram of example voltages at nodes of the second output circuit is shown. The common mode at the amplifier inputs in the operating condition lies between the desired output common mode and the input common mode at the pads. In a case where Ra=Rb, then the common mode at the amplifier input terminals is halfway between the pad and output common nodes, as shown in FIG. 8. A restriction on the voltage at the input pads would be governed by the termination network and electrostatic discharge devices (ESD) devices. The voltage potential at the amplifier inputs can be within the supply rails even if the external VCM is not.

Figure 9:
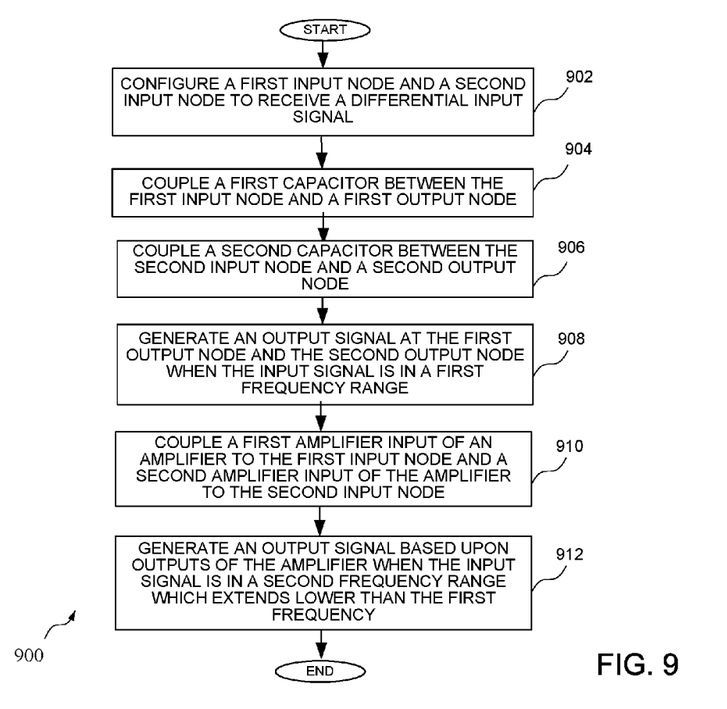
FIG. 9 is a flow chart showing a method of implementing a differential input receiver.

Turning now to FIG. 9, a flow chart shows a method of implementing a differential input receiver such as shown in FIGS. 4-6. In particular, a first input node and a second input node are configured to receive a differential input signal at a block 902. A first capacitor is coupled between the first input node and a first output node at a block 904. A second capacitor is coupled between the second input node and a second output node at a block 906. An output signal at the first output node and the second output node is generated when the input signal is in a first frequency range at a block 908. A first amplifier input of an amplifier is coupled to the first input node and a second amplifier input of the amplifier is coupled to the second input node at a block 910. An output signal is generated based upon outputs of the amplifier when the input signal is in a second frequency range which extends lower than the first frequency at a block 912. The second frequency range may extend to 0 Hz, DC.

It can therefore be appreciated that new circuits for and methods of implementing a differential input receiver have been described. It will be appreciated by those skilled in the art that numerous alternatives and equivalents will be seen to exist that incorporate the disclosed invention. As a result, the invention is not to be limited by the foregoing embodiments, but only by the following claims.

What is claim is:

1. A circuit for implementing a differential input receiver, the circuit comprising:
    an input circuit having a first input node and a second input node configured to receive a differential input signal;
    a first output circuit having a first capacitor coupled between the first input node and a first output node and a second capacitor coupled between the second input node and a second output node, wherein the first output circuit generates an output signal at the first output and the second output when the input signal is in a first frequency range; and
    a second output circuit comprising an amplifier having a first amplifier input coupled to the first input node and a second amplifier input coupled to the second input node, wherein the second output circuit generates an output signal when the input signal is in a second frequency range which extends lower than the first frequency range.

2. The circuit of claim 1 further comprising a first resistor coupled between the first input node and a first amplifier input, a second resistor coupled between the first amplifier input and a first amplifier output, a third resistor coupled between the second input node and a second amplifier input, and a fourth resistor coupled between the second amplifier input and a second amplifier output.

3. The circuit of claim 2 further comprising a first output resistor coupled between the first amplifier output and the first output node, and a second output resistor coupled between the second amplifier output and the second output node.

4. The circuit of claim 3 further comprising a first offset compensation circuit configured to generate a first voltage at the first output of the amplifier.

5. The circuit of claim 4 wherein the second resistor comprises a first series of resistors forming a first resistor divider network.

6. The circuit of claim 5 wherein the first offset compensation circuit comprises a current source configured to control a first offset voltage at a node of the first resistor divider network.

7. The circuit of claim 6 further comprising a second offset compensation circuit configured to generate a second voltage at the second output of the amplifier.

8. The circuit of claim 7 wherein the third resistor comprises a second series of resistors forming a second resistor divider network.

9. The circuit of claim 8 wherein the second offset compensation circuit comprises a current source configured to control a second offset voltage at a node of the second resistor divider network.

10. The circuit of claim 1 further comprising a control circuit configured to provide a common mode control signal to the amplifier circuit.

11. A method of implementing a differential input receiver, the method comprising:
configuring a first input node and a second input node to receive a differential input signal;
coupling a first capacitor between the first input node and a first output node;
coupling a second capacitor between the second input node and a second output node,
generating an output signal at the first output node and the second output node when the input signal is in a first frequency range;
coupling a first amplifier input of an amplifier to the first input node and a second amplifier input of the amplifier to the second input node; and
generating an output signal based upon outputs of the amplifier when the input signal is in a second frequency range which extends lower than the first frequency range.

12. The method of claim 11 further comprising coupling a first resistor between the first input node and a first amplifier input, coupling a second resistor between the first amplifier input and a first amplifier output, coupling a third resistor between the second input node and a second amplifier input, and coupling a fourth resistor between the second amplifier input and a second amplifier output.

13. The method of claim 12 further comprising coupling a first output resistor between the first amplifier output and the first output node, and coupling a second output resistor between the second amplifier output and the second output node.

14. The method of claim 13 further comprising configuring a first offset compensation circuit to generate a first voltage at the first output of the amplifier.

15. The method of claim 14 wherein the second resistor comprises a first series of resistors forming a first resistor divider network.

16. The method of claim 15 wherein the first offset compensation circuit comprises a current source configured to control a first offset voltage at a node of the first resistor divider network.

17. The method of claim 16 further comprising configuring a second offset compensation circuit to generate a second voltage at the second output of the amplifier.

18. The method of claim 17 wherein the third resistor comprises a second series of resistors forming a second resistor divider network.

19. The method of claim 18 wherein the second offset compensation circuit comprises a current source configured to control a second offset voltage at a node of the second resistor divider network.

20. The method of claim 11 further comprising configuring a control circuit to provide a common mode control signal to the amplifier circuit.

* * * * *